US009325110B2

(12) United States Patent  
Lostoski et al.

(10) Patent No.: US 9,325,110 B2
(45) Date of Patent: Apr. 26, 2016

(54) INPUT/OUTPUT MODULE

(71) Applicant: ROCKWELL AUTOMATION TECHNOLOGIES, INC., Mayfield Heights, OH (US)

(72) Inventors: Douglas Alan Lostoski, Richfield, OH (US); Nathan Joseph Molnar, Shaker Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 7 days.

(21) Appl. No.: 14/192,743

(22) Filed: Feb. 27, 2014

(65) Prior Publication Data

US 2015/0244107 A1 Aug. 27, 2015

(51) Int. Cl.
| | |
|---|---|
| H01R 13/60 | (2006.01) |
| H01R 13/627 | (2006.01) |
| H01R 9/24 | (2006.01) |
| H05K 7/14 | (2006.01) |
| H01R 13/629 | (2006.01) |

(52) U.S. Cl.
CPC .......... *H01R 13/6275* (2013.01); *H01R 9/2408* (2013.01); *H05K 7/1468* (2013.01); *H01R 13/629* (2013.01)

(58) Field of Classification Search
CPC ........... H01R 13/6275; H01R 13/6272; H01R 13/6335; H01R 13/635; H01R 13/629; H01R 43/26; H01R 13/62933
See application file for complete search history.

(56) References Cited

U.S. PATENT DOCUMENTS

| | | | | |
|---|---|---|---|---|
| 4,582,378 A | * | 4/1986 | Fruchard | 439/157 |
| 5,077,722 A | * | 12/1991 | Geist et al. | 720/657 |
| 5,641,296 A | * | 6/1997 | Larabell et al. | 439/342 |
| 5,842,889 A | * | 12/1998 | Kollmann | 439/716 |
| 6,172,875 B1 | * | 1/2001 | Suzuki et al. | 361/729 |
| 6,456,495 B1 | * | 9/2002 | Wieloch et al. | 361/729 |
| 2009/0047821 A1 | | 2/2009 | Chen et al. | |

FOREIGN PATENT DOCUMENTS

| | | |
|---|---|---|
| DE | 8505727 U1 | 4/1985 |
| DE | 3636088 C1 | 11/1987 |
| WO | 2009130529 A1 | 10/2009 |
| WO | 2010043933 A1 | 4/2010 |

OTHER PUBLICATIONS

Extended European Search Report Mailed Jul. 24, 2015.

* cited by examiner

*Primary Examiner* — Xuong Chung Trans
(74) *Attorney, Agent, or Firm* — Fletcher Yoder, P.C.

(57) ABSTRACT

An input/output (I/O) device for an automation control system may include a terminal base configured to physically and communicatively connect with an I/O module. The I/O module may include I/O communication circuitry and a latching mechanism that may allow the securing or releasing of the I/O module from the terminal base. The latching mechanism may include a release lever urged to a biased latched position by integral springs and a latch element with latching extensions configured to interact with the terminal base.

20 Claims, 8 Drawing Sheets

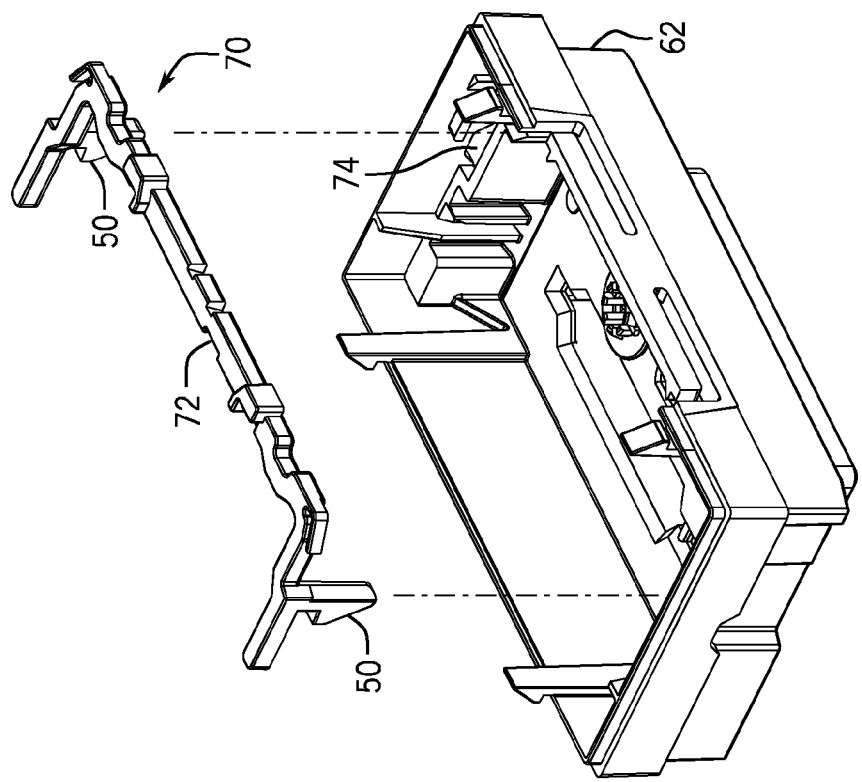
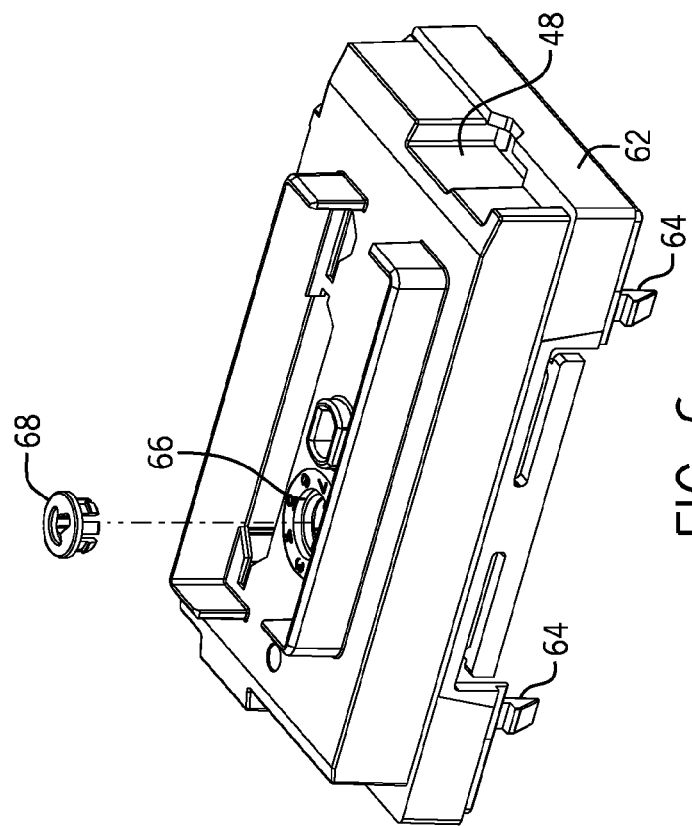
FIG. 7
FIG. 6

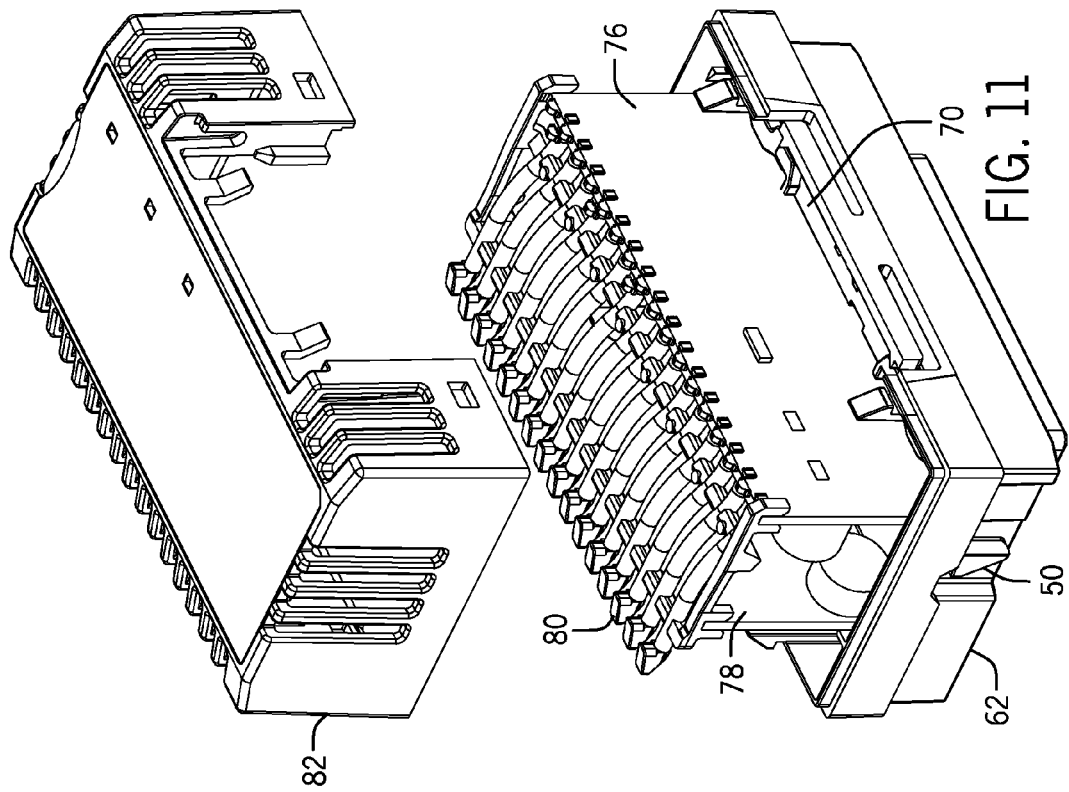
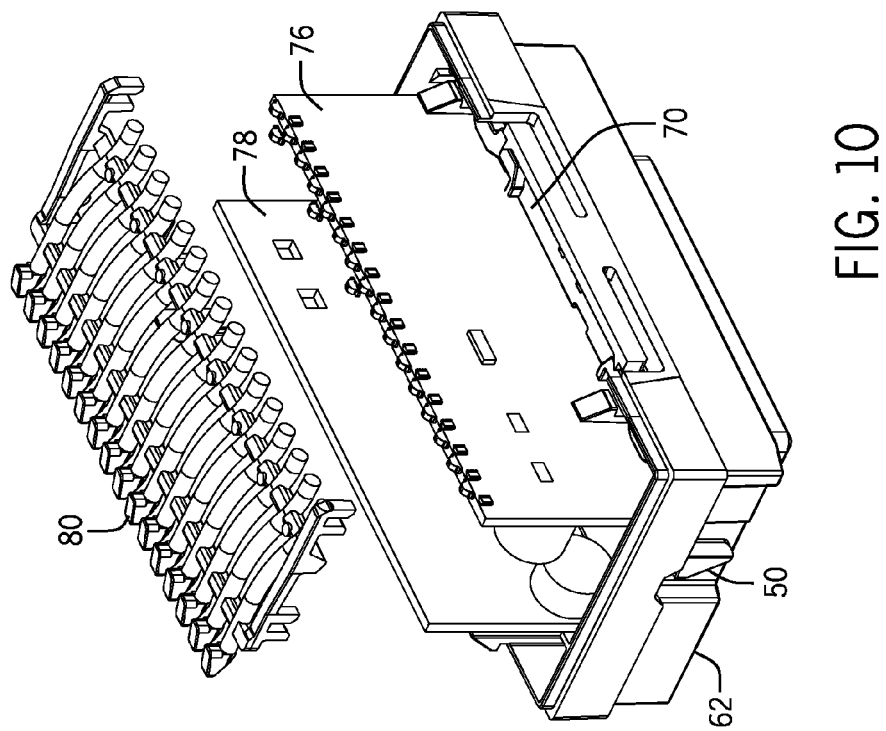

INPUT/OUTPUT MODULE

BACKGROUND

The present disclosure relates generally to the field of industrial automation control systems. More particularly, embodiments of the present disclosure relate to improving connection performance between an input/output (I/O) module and a terminal base as well as improving the user accessibility of the I/O module.

A wide range of applications exist for automation control, particularly systems that utilize sensors and actuators connected to control and/or monitoring equipment via I/O technology. I/O devices are used in a variety of applications, and play an important role in providing the functionality of automation control and monitoring systems. Further, in many applications, I/O devices are configured for coupling and interaction with an automation controller. Under the direction of stored programs, a processor of the automation controller examines a series of inputs (e.g., electrical input signals to the automation controller) reflecting the status of a controlled process, as well as preset or system-generated signals, and changes outputs (e.g., electrical output signals from the automation controller) based on analysis and logic for affecting control of the controlled process. The stored control programs may be continuously executed in a series of execution cycles, executed periodically, or based on events, or on any other desired basis. The inputs received by the automation controller from the controlled process and the outputs transmitted by the automation controller to the controlled process are normally passed through one or more I/O devices, that serve as an electrical interface between the automation controller and the controlled process.

Generally, a latching mechanism for an I/O module is provided at a base of the module, and attaching the module to the base may involve multiple steps to ensure a reliable connection. In many cases, the I/O modules are disposed in locations that may be difficult and/or inconvenient to access for operators charged with maintaining I/O racks. Consequently, difficulties may often be experienced when initially installing and subsequently servicing such equipment. Moreover, in some applications, mounting and mechanical positioning may result in less than optimal reliability of I/O module to base connections.

These conventional techniques suffer from significant limitations, and there is a need for improved I/O technology, particularly for improved module retention and ease of use.

BRIEF DESCRIPTION

Certain embodiments commensurate in scope with the originally claimed invention are summarized below. These embodiments are intended only to provide a brief summary of possible forms of the invention. Indeed, the invention may encompass a variety of forms that may be similar to or different from the embodiments set forth below.

In one embodiment, an input/output (I/O) device for an automation control system includes a terminal base, an I/O module securable to the terminal base to provide communication between components coupled to the terminal base and remote automation devices, and a latch for coupling the I/O module to the terminal base containing a release lever may actuate a latch element having a pair of lateral latching extensions that interface with the terminal base to secure the I/O module to the terminal base.

In another embodiment, a latching mechanism includes a latch element securing an I/O module to a terminal base having a pair of lateral latching extensions interacting with the terminal base, a release lever may actuate the latch element to release the input/output module from the terminal base, and a pair of counterbalanced integral spring elements in the input/output module that urge the latch element to a biased latched position.

In yet another embodiment, a method for securing and releasing an input/output module to a terminal base includes inserting the I/O module into the terminal base in a first movement, securing the component with the base portion, grasping a front side of the I/O module and a release lever located on the back side, activating the release lever, and moving the I/O device away from the terminal base.

DRAWINGS

These and other features, aspects, and advantages of the present invention will become better understood when the following detailed description is read with reference to the accompanying drawings in which like characters represent like parts throughout the drawings, wherein:

FIG. 6 is an inverted perspective view of a lower housing of an I/O module in accordance with embodiments of the present techniques;

FIG. 7 is an exploded perspective view of a lower housing of an I/O module including a latch element in accordance with embodiments of the present techniques;

FIG. 10 is an exploded perspective view of a lower housing of an I/O module including a latch element, a system circuit board, an I/O circuit board, and a lightpipe in accordance with embodiments of the present techniques;

FIG. 11 is an exploded perspective view of a populated lower housing of an I/O module and an upper housing of an I/O module in accordance with embodiments of the present techniques;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
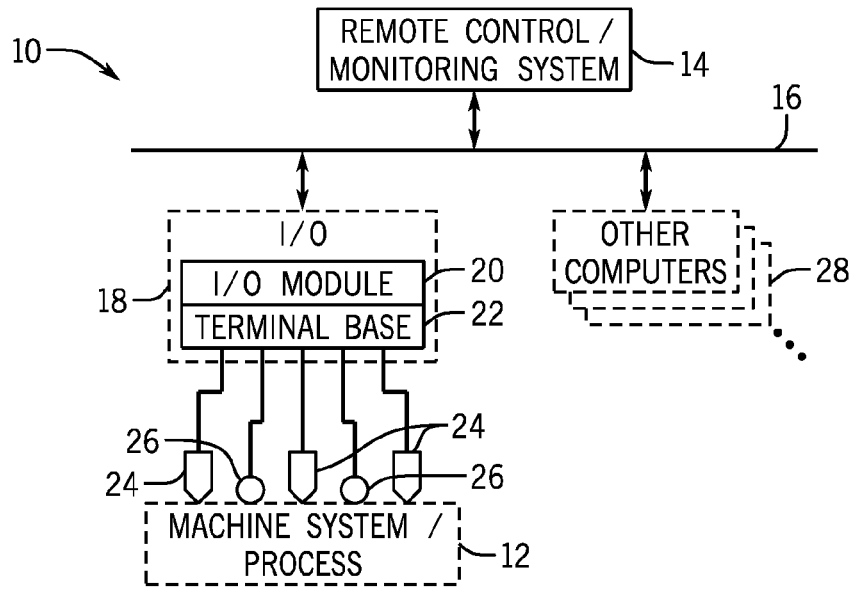
FIG. 1 is a diagrammatical representation of an exemplary remote control and monitoring system adapted to interface with networked components and configuration equipment in accordance with embodiments of the present techniques.

FIG. 1 is a diagrammatical representation of an exemplary automation system adapted to interface with networked components and configuration equipment in accordance with embodiments of the present techniques. The automation system is generally indicated by reference numeral 10. Specifically, the automation system 10 is illustrated as including a machine system or process 12 and a remote control and monitoring system 14 adapted to interface through a network 16 with an input/output (I/O) device 18. The I/O device 18 may include an I/O module 20 and a terminal base 22. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The machine system or process 12 may take many forms and include devices for accomplishing many different and varied purposes. For example, the machine system or process 12 may include a compressor station, an oil refinery, a batch operation for making food items, a mechanized assembly line, and so forth. Accordingly, the machine system or process 12 may include a variety of operational components, such as electric motors, valves, actuators, temperature elements, pressure sensors, or a myriad of manufacturing, processing, material handling, and other applications. Further, the machine system or process 12 may include control and monitoring equipment for regulating process variables through automation and/or observation.

For example, the illustrated machine system or process 12 may include sensors 24 and actuators 26. The sensors 24 may include any number of devices adapted to provide information regarding process conditions. The actuators 26 may include any number of devices adapted to perform a mechanical action in response to a signal from a controller (e.g., an automation controller). The sensors 24 and actuators 26 may be utilized to operate process equipment. Indeed, they may be utilized within process loops that are monitored and controlled by the remote control/monitoring system 12. Such a process loop may be activated based on process inputs (e.g., input from a sensor 24) or direct operator input received through other computers 28 also communicating via the network 16.

As illustrated, the sensors 24 and actuators 26 are in communication with the remote control and monitoring system 14. As illustrated, the sensors 24 and actuators 26 may communicate with the remote control and monitoring system 14 via an I/O device 18 in communication with the remote control and monitoring system 14 by way of the network 16. The I/O device 18 may transfer input and output signals between the remote control and monitoring system 14 and the machine system or process 12. The I/O device 18 serves as an electrical interface to the remote control and monitoring system 14 and may be located proximate to or remote from the remote control and monitoring system 14. Additionally, several I/O devices 18 may be used simultaneously to facilitate an appropriate amount of input and output signal capabilities of the automation system 10.

The I/O devices 18 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 18 may convert between AC and DC analog signals used by devices on a controlled machine or process and DC logic signals used by the remote control and monitoring system 14. Additionally, some I/O devices 18 may provide digital signals to digital I/O devices and receive digital signals from digital I/O devices. Further, in some embodiments, the I/O devices 18 that are used to control machine devices or process control devices may include local microcomputing capability on an I/O module 20 of the I/O devices 18. In addition, the I/O devices 18 may include several components that may be coupled together, as described in greater detail below. In various embodiments, the I/O devices 18 may include mechanisms to enable the components to be coupled, locked, and/or released from one another.

In some embodiments, the I/O devices 18 may be located in close proximity to a portion of the control system, and away from the remainder of the remote control and monitoring system 14. In such embodiments, data may be communicated with remote modules over a common communication link, or network 16, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
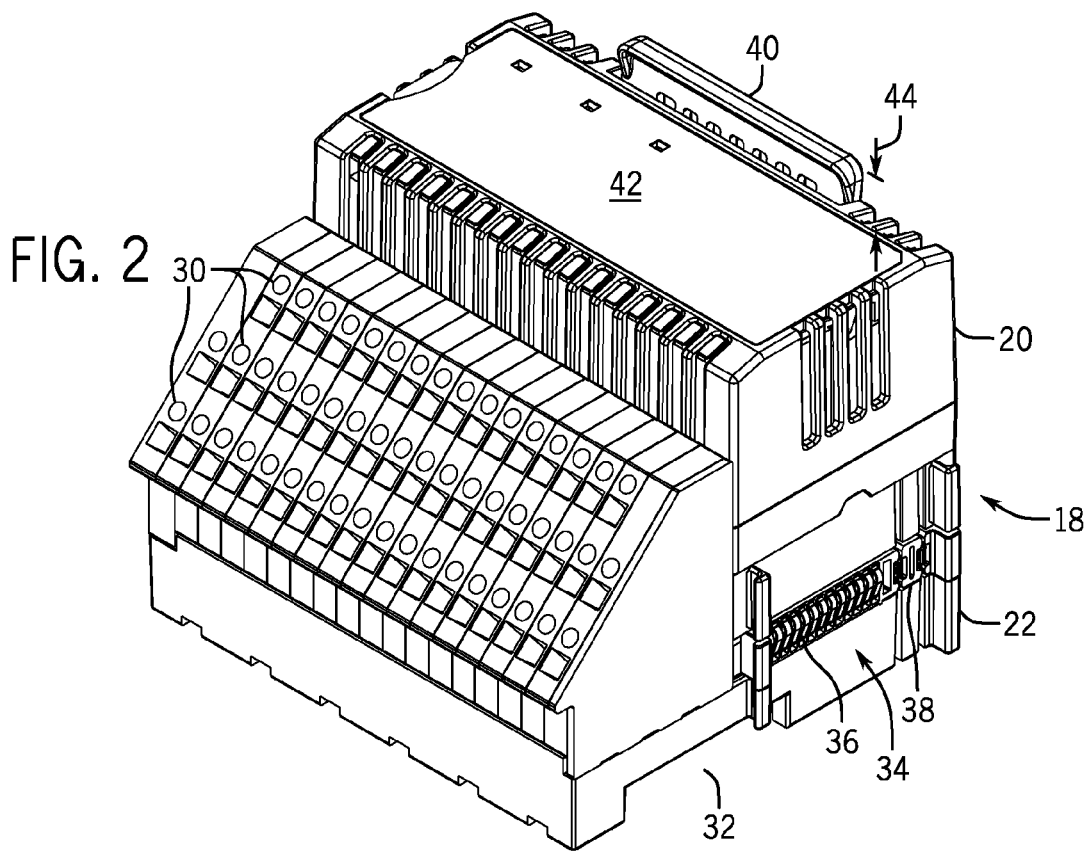
FIG. 2 is a front perspective view of an input/output (I/O) device including an I/O module secured to an I/O terminal base in accordance with embodiments of the present techniques.

FIG. 2 is a front perspective view of an I/O device 18 including an I/O module 20 secured to a terminal base 22 in accordance with embodiments of the present techniques. The terminal base 22 may provide system power to the I/O module 20, as well as enable conversion between the communications protocols of the I/O module 20 and a remote control/monitoring device. As illustrated, the terminal base 22 includes a plurality of wiring terminals 30. Additionally, the terminal base 22 includes a rail mount 32 for mounting the I/O device 18 to a DIN rail (not shown), which is an industry standard support rail for mounting control equipment in racks and cabinets. As described in greater detail below, a plurality of I/O devices 18 may be electrically coupled in series along a DIN rail such that field power and system information and power may be communicated between the I/O devices 18, and back through the terminal base 22 to the remote control/monitoring device. In other embodiments, a different type of mounting structure may be used.

Facilitating connecting the I/O devices 18 in series is a conductor section 34 of the terminal base 22. The conductor section 34 may include data conductors 36 and power bus conductors 38. The data conductors 36 allow data communication between the I/O devices 18 connected in series with each other. Additionally, the power bus conductors 38 provide power linking of the I/O devices 18 such that a single power source may supply power to the series of the I/O devices 18.

In general, the I/O device 18 receives input signals from the field devices via wiring terminals 30, delivers output signals to the field devices also via wiring terminals 30, performs general and/or specific local functionality on the inputs and/or outputs, communicates the inputs and/or outputs to a remote control/monitoring system and/or the other I/O devices 18 via wiring terminals 30 and/or data conductors 36, and so forth. In addition, the I/O module 20 includes a release lever 40 to facilitate release from the terminal base 22 as described in detailed below. In one embodiment, the release lever 40 may extend beyond an upper surface 42 of the I/O module 20 by way of an extension 44. The extension 44 facilitates removal of the I/O module 20 from the terminal base 22 by allowing an operator to interact with an area of the I/O module 20 that may be easily accessible. It should be noted that because rows of the I/O devices 18 may be placed in close proximity, ease of access to the release lever 40 of the I/O module 20 from a terminal base 22 may enhance user accessibility of the I/O device 18. Additionally, the configuration of the release lever 40 may enable the I/O module 20 to be used in the terminal base 22 with either a horizontal or a vertical orientation. Because a latch element and a latching mechanism are both fully encased within the I/O module 20, only the release lever 40 may be unobstructed in order for various orientations of the I/O module 20 and the terminal base 22 to function.

Figure 3:
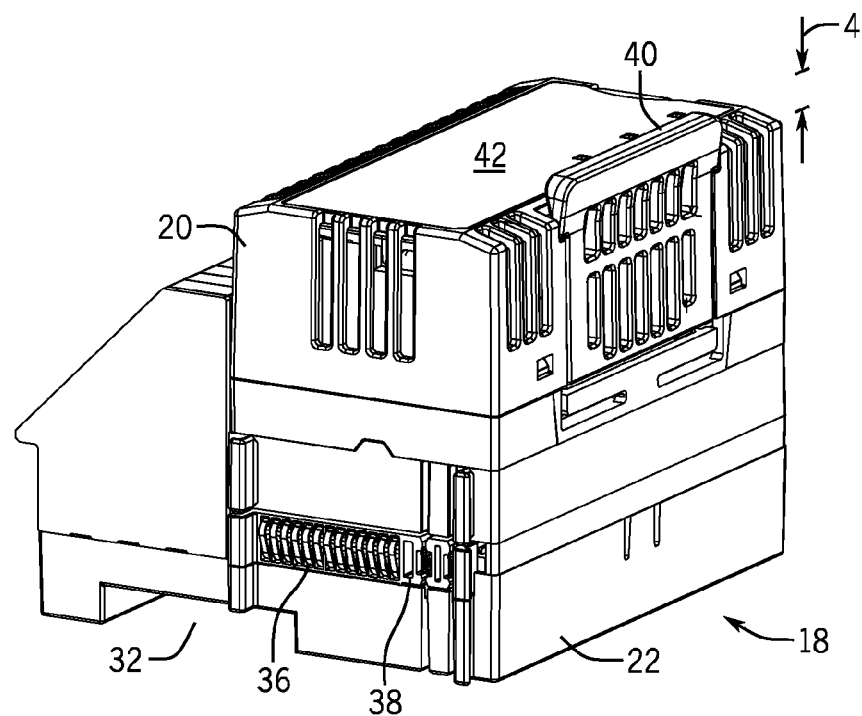
FIG. 3 is a rear perspective view of an I/O module secured to an I/O terminal base in accordance with embodiments of the present techniques.

FIG. 3 is a rear perspective view of the I/O device 18 including the I/O module 20 secured to the terminal base 22 in accordance with embodiments of the present techniques. In this view, the release lever 40 is more completely visible. In some embodiments, the release lever 40 may have the extension 44 above the upper surface 42 of the I/O module 20. This view demonstrates that while the extension 44 extends above the upper surface 42, it may only include a small portion of the release lever 40. Additionally, it may be beneficial to note that a side of the I/O device 18 that may not be coupled to an additional I/O device 18 may have an end cap (not shown) such that data conductors 36 and power conductors 38 on terminal base 22 may not be exposed while the I/O device 18 is in service. In at least one embodiment, release lever 40 may be spring biased into a latched position as displayed in FIG. 3.

Figure 4:
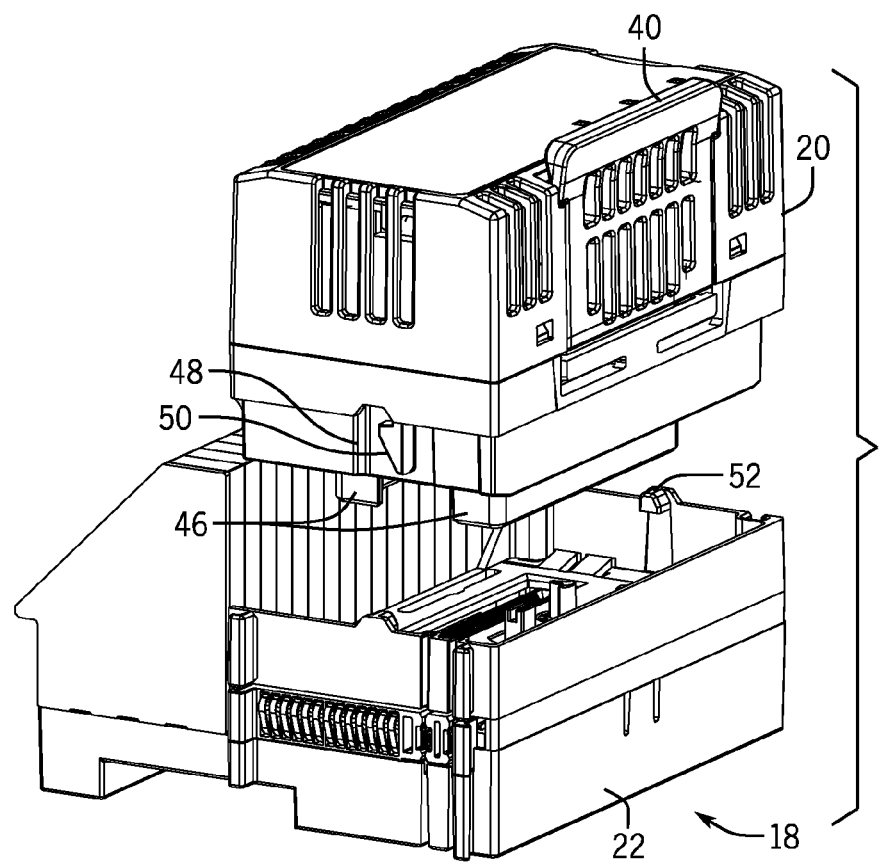
FIG. 4 is an exploded perspective view of an exemplary I/O device that includes a latching element in accordance with embodiments of the present techniques.

FIG. 4 is an exploded rear perspective view of the I/O device 18 including the I/O module 20 removed from the terminal base 22. In one embodiment, connectors 46 are attached to the base of I/O module 20. The connectors 46 may include extensions of the I/O module 20 housing in order to provide additional support for the connection between the I/O module 20 and the terminal base 22. Additionally, the connectors 46 may include circuitry connection devices in order for the circuitry of I/O module 20 to interact with the sensors 24 or actuators 26 of the machine system or process 12 by way of the terminal base 22.

This view also displays a recess 48 in the I/O module 20 that allows for the latching extension 50 to protrude from an interior of the I/O module 20. The latching extension 50 provides a location to secure the I/O module 20 to the terminal base 22. Further, the latching extension 50 may include an inclined surface to where pressure may be applied on the I/O module 20 towards the terminal base 22, which may cause the inclined surface to interact with a latch catch 52. This interaction may force the latching extension 50 to be displaced from its typical orientation. Additionally, displacing the latching extension 50 from its typical orientation may also briefly force release lever 40 out of a locking position and into a releasing position. Further, when the latching extension 50 extends beyond a bottom portion of the latch catch 52, the spring biased release lever 40 may return to its latched position.

It should be noted that the release lever 40 may not be necessary to facilitate securing the I/O module 20 to the terminal base 22. In one embodiment, the latching extensions 50 may interact with the latch catches 52 on the inclined surface of the latching extensions 50. Because the interaction between the latching extensions 50 and the latch catches 52 may force an activation of the latch element to occur independently from an activation of the release lever 40, a user of the I/O device 18 may not need to activate the release lever 40 in order to secure the I/O module 20 in the terminal base 22. Instead, securing the I/O module 20 may be accomplished simply by pressing against an upper surface of the I/O module 20 towards the terminal base 22.

Furthermore, in one embodiment, two latching extensions 50 may be located on opposite ends of the I/O module 20. Additionally, two latch catches 52, which may interact with the two latching extensions 50, may be located on opposite ends of the terminal base 22. The latching extensions 50 and the latch catches 52 may also be located in a position along a center of mass of the I/O module 20. As such, having two latching locations on either side of the I/O device, as well as having the latching locations located on the center of mass, may provide the I/O module 18 with a more secure berthing than an I/O module with just a single latch in an unbalanced location.

Figure 5:
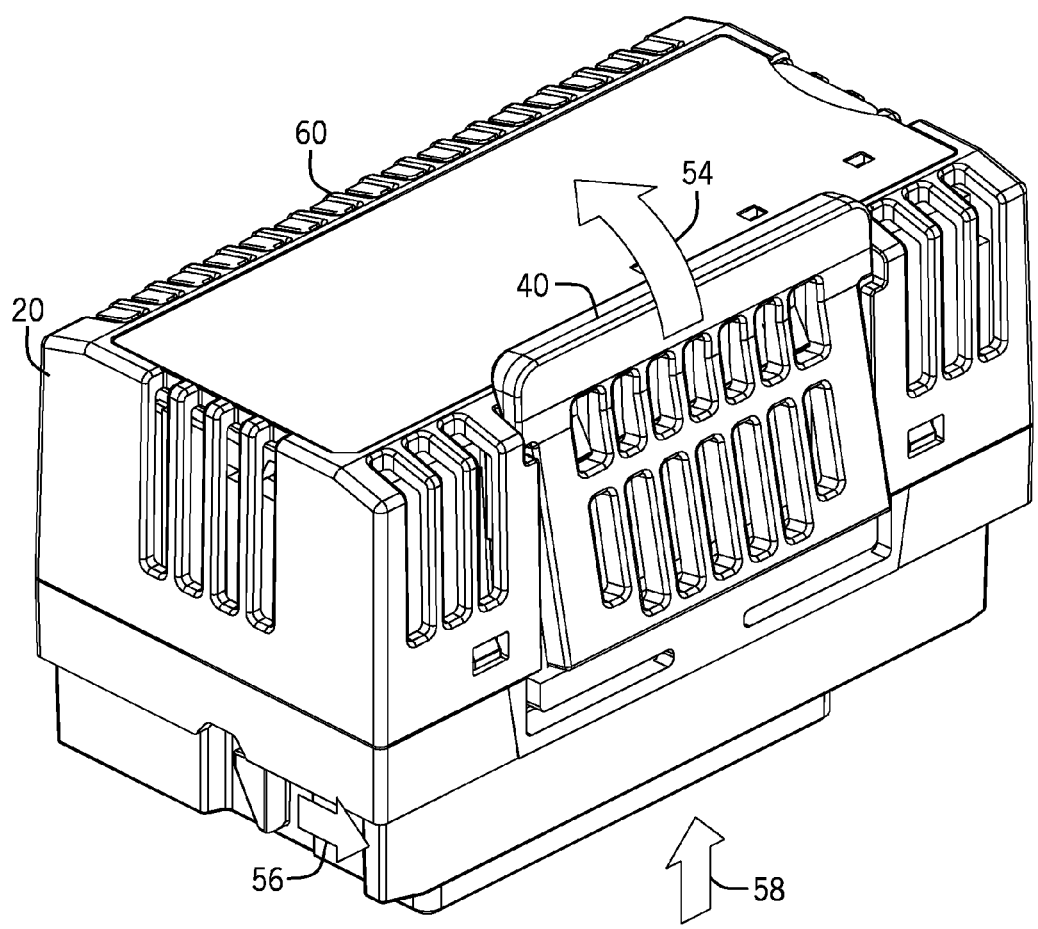
FIG. 5 is a rear perspective view of an I/O module including an activated representation of a release lever in accordance with embodiments of the present techniques.

Turning now to FIG. 5, a rear perspective view of the I/O module 20 including an activated representation of the release lever 40 is illustrated in accordance with embodiments of the present techniques. The I/O module 20 is shown with the release lever 40 pivoted in a direction of arrow 54. The arrow 54 pivot may allow the release lever 40 to interact with the latch element including the latching extensions 50. An interaction between the release lever 40 and the latch element results in the latching extensions 50 moving in the direction indicated by arrow 56. The arrow 56 movement of the latching extensions may cause the I/O module 20 to unlatch from the terminal base 22 and subsequently may allow for detachment from the terminal base 22 when a user pulls up on the I/O module 20 in a direction of arrow 58.

In general, the release lever 40 is pivotable towards a front side 60 on the I/O module 20 as indicated by the arrow 54. A pivot in direction of arrow 54 may be accomplished by grasping contact with the front side 60 of the I/O module 20 and the upper extension 44 of the release lever 40. Further, activating the release lever 40 by the pivot in the direction of arrow 54 may allow the user to pull up on the I/O module 20 and move the I/O module 20 away from the terminal base 22 in the direction of arrow 58. The position of the release lever 40 may allow for a user to easily access a release mechanism of the I/O device. For example, spacing between I/O racks is typically limited; therefore, providing the release mechanism of the I/O module 20 from the terminal base 22 in an easily accessible location may be an important consideration in the I/O device design.

FIGS. 6-13 illustrate how an embodiment of the I/O module 20 is erected. The figures provide a step by step approach to assembling an embodiment of the I/O module 20 in order to further demonstrate how the release mechanism within the I/O module 20 may function. Additionally, the figures may demonstrate how the various elements mentioned above and below interact with each other in order to produce a desired securing and releasing mechanism.

FIG. 6 is an inverted perspective view of a lower housing 62 of the I/O module 20 in accordance with embodiments of the present techniques. The lower housing 62 may include tabs 64 that may be used to attach the lower housing 62 to an upper housing (not shown). The tabs 64 may be designed in such a way to allow access to the inner portion of the I/O module 20 without the use of tools. Additionally, an aperture 66 is illustrated in this embodiment. The aperture 66 may receive an I/O key 68. The I/O key 68 may mechanically key the I/O module 20 to the terminal base 22. Keying the I/O module 20 to the terminal base 22 may prevent incidental swapping of the I/O module 20 into an adjacent terminal base 22. Therefore, when the I/O module 20 includes the I/O key 68, it may include a unique position for the I/O key 68 to represent a specific type of the I/O module 20 (e.g., digital, analog, AC, etc.). Further, the terminal base 22 may contain a corresponding receptor key of the I/O key 68. The corresponding receptor key of the I/O key 68 is rotatable, and upon installation of the I/O module 20, the corresponding receptor key may be rotated to a position that accepts the specific type of the I/O module 20 installed on the terminal base 22. This illustration also displays the recess 48 from a different angle. Again, the recesses 48 may allow for the latching extensions 50 to extend from the inner portion of the I/O module 20 in order to interact with the latch catches 52 of the terminal base 22.

FIG. 7 is an exploded perspective view of the lower housing 62 of the I/O module 20 including a latch element 70 in accordance with embodiments of the present techniques. The latch element 70 is composed of the latching extensions 50 and an actuation bar 72 extending between the latching extensions 50. Further, the latch element 70 may be deposited into the lower housing 62 in such a manner that the latching extensions 50 extend through a pair of passages 74 of the lower housing 62.

Additionally, in some embodiments, the latch element 70 may be composed of a single piece of material. The single piece of material may be of a lower coefficient of friction than a material that makes up the lower housing 62. Because the latch element 70 is made up of the single piece of material, the latch extensions 50 and the actuation bar 72 may provide a stable structure to the latching mechanism. Further, the lower coefficient of friction of the latch element 70 may provide less resistance during release lever actuation to release the I/O module 20 from the terminal base 22. Furthermore, the lower coefficient of friction may also provide a longer life expectancy for the releasing and securing mechanism of the I/O module 20 due to a lower amount of friction associated with actuating the release lever 40.

Figure 8:
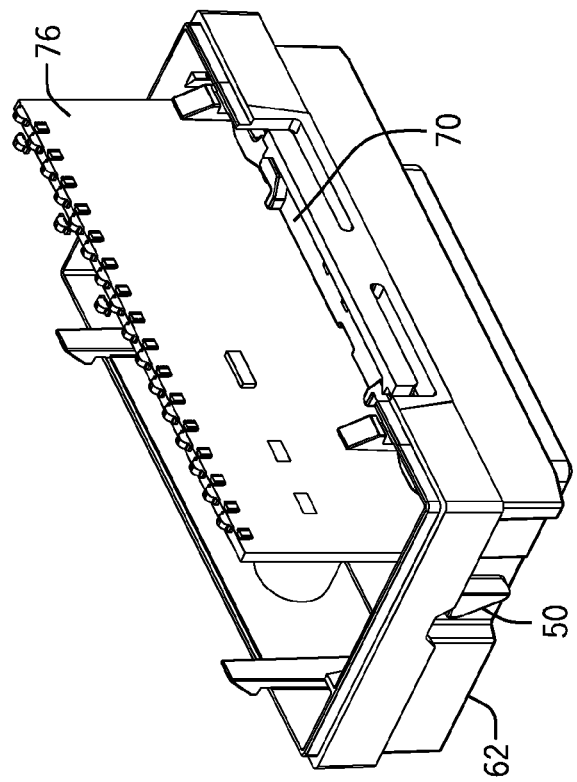
FIG. 8 is a perspective view of a lower housing of an I/O module including a latch element and a system circuit board in accordance with embodiments of the present techniques.

FIG. 8 is a perspective view of the lower housing 62 of the I/O module 20 including the latch element 70 and a system circuit board 76 in accordance with embodiments of the present techniques. This view shows the lower housing 62 in an embodiment where it may be populated by circuitry that controls functions of the I/O module 20. Additionally, the representation of this embodiment demonstrates that the latch element 70 may not interfere or interact with system circuit board 76. Latch element 70, as displayed in FIG. 8, is in a latched position. This indicates that the latch element 70 may not come any closer to system circuit board 76 during normal operation of the I/O module 20. Indeed, upon activation of the latch element 70 in this embodiment, the latch element 70 may move away from system circuit board 76. Therefore, the latching mechanism of the present embodiment may not interfere with any functions or configurations of the system circuit board 76.

Figure 9:
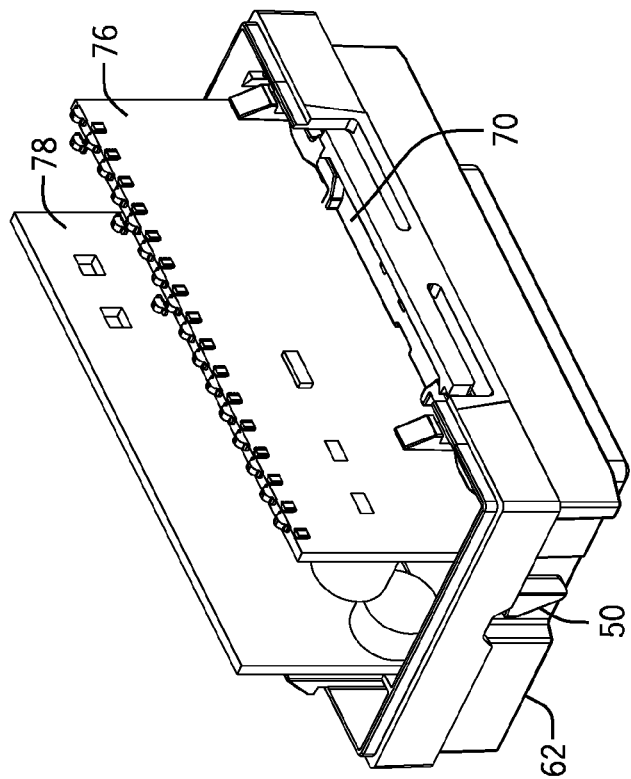
FIG. 9 is a perspective view of a lower housing of an I/O module including a latch element, a system circuit board, and an I/O circuit board in accordance with embodiments of the present techniques.

Turning now to FIG. 9, a perspective view of the lower housing 62 of the I/O module 20 is shown including the latch element 70, the system circuit board 76, and an I/O circuit board 78 in accordance with embodiments of the present techniques. This view demonstrates the interior of the I/O module 20 as displayed in FIG. 8 but further populated by the I/O circuit board 78. Again, in at least one embodiment, the latch element 70 may not interfere or interact with circuit boards 76 and 78 during normal operation of the I/O module 20.

FIG. 10 is an exploded perspective view of the lower housing 62 of the I/O module 20 including the latch element 70, the system circuit board 76, the I/O circuit board 78, and a lightpipe 80 in accordance with embodiments of the present techniques. The lightpipe 80 may transmit light from LEDs mounted on the system circuit board 76 and/or the I/O circuit board 78. The LEDs of the circuit boards 76 and 78 from which light may be transmitted may provide a visual representation of how each row of the wiring terminals 30 of the terminal base 22 in the I/O device 18 are interacting with the circuitry of the I/O module 20. The light from the LEDs may travel through the lightpipe 80 and may be displayed directly above each LED's respective wiring terminal row when the I/O module 20 is in use.

FIG. 11 is an exploded perspective view of a populated lower housing 62 of the I/O module 20 and an upper housing 82 of the I/O module 20 in accordance with embodiments of the present techniques. In one embodiment, the upper housing 82 may fit around a latch element 70, system circuit board 76, I/O circuit board 78, and lightpipe 80 and secure itself to the lower housing 62 of the I/O module 20. Further, the emitting ends of lightpipe 80 may fit between side vents of the upper housing 82 in order to emit light from the LEDs on the circuit boards 76 and 78 that is visible to a user.

Figure 12:
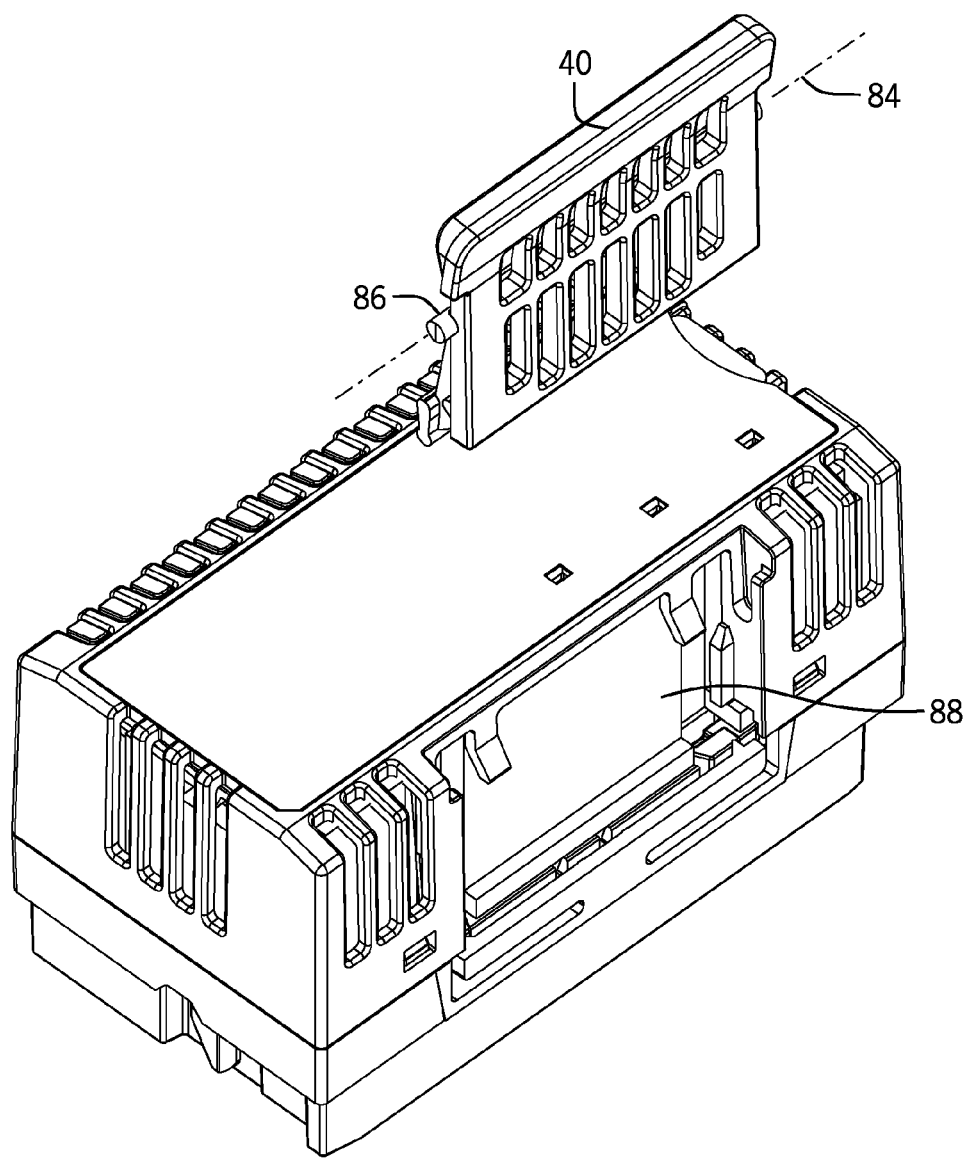
FIG. 12 is an exploded perspective view of an I/O module including a lever in accordance with embodiments of the present techniques.

FIG. 12 is an exploded perspective view of the I/O module 20 including the release lever 40 in accordance with embodiments of the present techniques. The release lever 40 may be mounted as a first degree lever. A first degree lever may occur when a pivot (fulcrum) is between an effort and a load. In this embodiment, the release lever 40 pivots about a pivot axis 84. The load of the release lever is the latch element 70 that interacts with the release lever 40. The effort occurs on the upper extension 44 of the release lever 40, which may extend above a top surface 42 of the I/O module 20. Additionally, the pivot axis 84 of the release lever 40 is created by a location of extensions 86 on the release lever 40.

Figure 13:
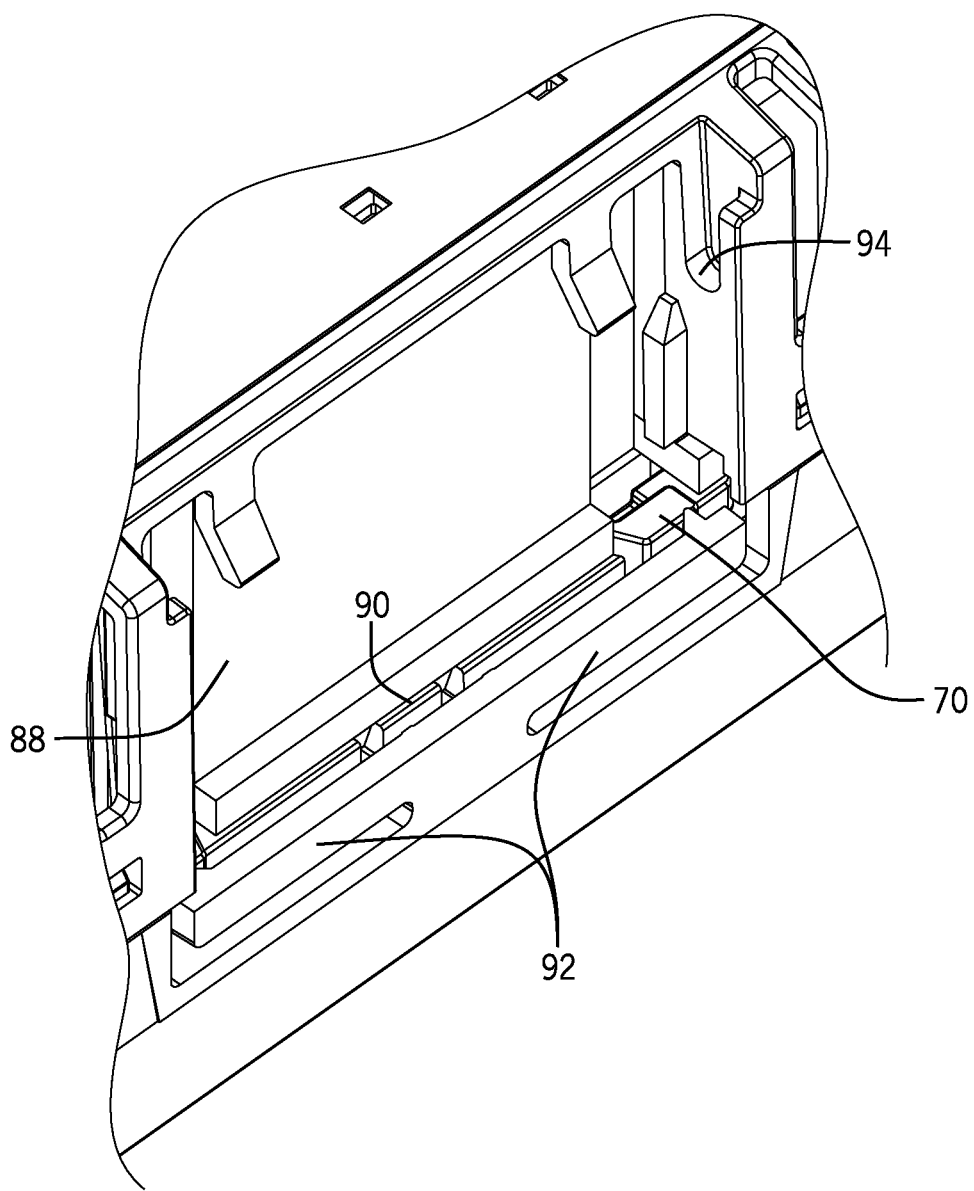
FIG. 13 is a partial perspective view of an I/O module detailing a receiving area for a lever.

Further, FIG. 13 is a partial perspective view of the I/O module 20 detailing a receiving area for the release lever 40. A recess 88 may accept the release lever into the upper housing 82 of the I/O module 20. Additionally, a bar interface 90 for the actuation bar 72 of the latch element 70 may be located near the bottom of the recess 88 in order to provide an interface between the latch element 70 and the release lever 40. Upon activation of the release lever 40, the release lever 40 may interact with the bar interface 90 to displace the latch element 70 and allow the user to remove the I/O module 20 from the terminal base 22.

In one embodiment, a pair of counterbalanced integral springs 92 in the I/O module 20 may urge the latch element 70 to a biased latched position. The pair of integral springs 92 may be generally symmetrically disposed below the release lever 40. In such an embodiment, the release lever may interact with the bar interface 90 in order to push the latch element 70 against the pair of counterbalanced integral springs 92 and cause the latch element 70 to reach an unlatched position. Once in the unlatched position, a user may remove the I/O module 20 from the terminal base 22 by exerting force on the I/O module 20 in a direction away from the terminal base 22.

Additionally, receivers 94 may receive a pair of release lever extensions protruding from the release lever 40 in order for the release lever to be pivotally mounted to the upper housing 82 of the I/O module 20. The release lever extensions, when confined in the receivers 94, may create the pivot axis 84 of the release lever 40. The location of the pivot axis may determine, at least in part, how much force may be required to activate the latch element 70 and move it to an unlatched position. The integral springs 92 may also be generally aligned vertically with the pivot axis 84 of the release lever 40.

While only certain features of the invention have been illustrated and described herein, many modifications and changes will occur to those skilled in the art. For example, while securing and releasing features are illustrated on specific components of an I/O device in the figures described above, in other embodiments, such features may be incorporated with other or additional components of an I/O device. It is, therefore, to be understood that the appended claims are intended to cover all such modifications and changes as fall within the true spirit of the invention.

The invention claimed is:

1. An automation input/output, comprising:
   a terminal base;
   an input/output module securable to the terminal base to provide communication between components coupled to the terminal base and remote automation devices; and
   a latch for coupling that in operation secures the input/output module to the terminal base, the latch comprising a pivoted release lever, and a latch element, separate from the pivoted release lever, actuated by pivoting the release lever to overcome a force on the release lever provided by an integral spring to urge the latch element of the I/O module, separate from the release lever, to an unlatched position, the latch element having a pair of lateral latching extensions that interface with the terminal base to secure the input/output module to the terminal base.

2. The automation input/output of claim 1, comprising a pair of counterbalanced integral spring elements in the input/output module that urge the latch element to pivot toward a biased latched position.

3. The automation input/output of claim 2, wherein the spring elements are symmetrically disposed below the release lever.

4. The automation input/output of claim 3, wherein the spring elements are aligned vertically with a pivot axis of the release lever.

5. The automation input/output of claim 1, wherein the release lever extends above an upper surface of the input/output module.

6. The automation input/output of claim 1, wherein the release lever is pivotally mounted to a housing of the input/output module.

7. The automation input/output of claim 6, wherein an upper extension of the release lever is pivotable toward a front side of the input/output module for release of the input/output module from the terminal base in response to a grasping contact on the front side of the input/output module and the upper extension of the release lever.

8. The automation input/output of claim 1, wherein the latch element is a single piece comprising the pair of lateral latching extensions and an actuation bar extending between the latching extensions.

9. The automation input/output of claim 1, wherein the input/output module and the terminal base in operation are capable of positioning both horizontally and vertically.

10. The automation input/output of claim 1, wherein the latching extensions each include an inclined surface that causes the respective latching extension to be displaced for insertion of the input/output module into the terminal base as the inclined surfaces come in contact with latch catches of the terminal base.

11. A latching mechanism, comprising:
    a latch element that in operation is securing an input/output module to a terminal base, the latch element having a pair of lateral latching extensions to interface with the terminal base and to secure the input/output module to the terminal base;
    a pivoted release lever, separate from the latch element, that in operation is actuating the latch element to release the input/output module from the terminal base; and
    a pair of counterbalanced integral spring elements in the input/output module that in operation is urging the latch element and the release lever toward a biased latched position.

12. The latching mechanism of claim 11, wherein the lateral latching extensions are positioned on opposite ends of the input/output module.

13. The latching mechanism of claim 12, wherein the lateral latching extensions are further positioned along a center of mass of the input/output module.

14. The latching mechanism of claim 13, wherein a material used to fabricate the latch element has a lower coefficient of friction than a material used to fabricate the input/output module.

15. The latching mechanism of claim 11, wherein the release lever is mounted as a first degree lever.

16. The latching mechanism of claim 11, wherein the release lever extends above an upper surface of the input/output module.

17. A method for securing and releasing an input/output (I/O) module from a terminal base, comprising:
    securing the input/output module to the terminal base;
    grasping a front side of the I/O module and a pivoted release lever located on a back side of the I/O module;
    pivoting the release lever by overcoming a force on the release lever provided by an integral spring to urge a latch element of the I/O module, separate from the release lever, to an unlatched position; and
    pulling the I/O module away from the terminal base.

18. The method of claim 17, wherein activating the release lever is accomplished by grasping inward on the front side of the I/O module and on the release lever with a sufficient grasping force to overcome the force on the release lever provided by the integral spring.

19. The method of claim 17, wherein securing the input/output module to the terminal base is accomplished without the use of the release lever.

20. The method of claim 17, wherein securing and releasing the input/output module from the terminal base is not changed by an orientation of the input/output module and the terminal base.

* * * * *